(12) United States Patent
Kim et al.

(10) Patent No.: US 10,694,134 B2
(45) Date of Patent: Jun. 23, 2020

(54) COMPARISON DEVICE AND CMOS IMAGE SENSOR INCLUDING THE SAME

(71) Applicant: SK hynix Inc., Icheon-si (KR)

(72) Inventors: Hyeon-June Kim, Yeosu-si (KR); Hoe-Sam Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 7 days.

(21) Appl. No.: 16/219,857

(22) Filed: Dec. 13, 2018

(65) Prior Publication Data

US 2019/0246058 A1 Aug. 8, 2019

(51) Int. Cl.
*H04N 5/3745* (2011.01)
*H04N 5/378* (2011.01)
*H01L 27/146* (2006.01)
*H04N 5/374* (2011.01)

(52) U.S. Cl.
CPC ... *H04N 5/37455* (2013.01); *H01L 27/14645* (2013.01); *H04N 5/378* (2013.01); *H04N 5/3741* (2013.01)

(58) Field of Classification Search
CPC .. H04N 5/37455; H04N 5/378; H04N 5/3741; H04N 5/3745; H04N 5/374; H01L 27/14645
See application file for complete search history.

(56) References Cited

U.S. PATENT DOCUMENTS

| | | | | |
|---|---|---|---|---|
| 7,564,308 B1 * | 7/2009 | Vats | .................... | H03F 3/45121 330/255 |
| 7,724,063 B1 * | 5/2010 | Chang | .................... | H03F 3/005 327/337 |
| 7,893,766 B1 * | 2/2011 | Cranford, Jr. | ......... | H03F 1/3211 330/258 |
| 7,973,569 B1 * | 7/2011 | Bashar | ................. | H03K 3/3565 327/67 |
| 8,575,969 B2 * | 11/2013 | Sakakibara | .... | H03K 19/018585 327/53 |
| 10,021,331 B2 | 7/2018 | Sakakibara et al. | | |
| 2007/0164197 A1 * | 7/2007 | Boemler | .............. | H04N 5/3745 250/214 A |
| 2011/0298644 A1 * | 12/2011 | Ohba | ...................... | H03F 3/005 341/155 |
| 2012/0062279 A1 * | 3/2012 | Kuhn | ................. | G01R 19/0084 327/65 |
| 2016/0360138 A1 * | 12/2016 | Meynants | ......... | H01L 27/14609 |
| 2018/0288346 A1 * | 10/2018 | Yoshida | ................. | H04N 5/378 |
| 2018/0302578 A1 * | 10/2018 | Ebihara | .............. | H01L 27/1255 |

FOREIGN PATENT DOCUMENTS

JP 2015-126454 7/2015

* cited by examiner

*Primary Examiner* — Albert H Cutler
(74) *Attorney, Agent, or Firm* — Perkins Coie LLP

(57) ABSTRACT

A comparison device includes a comparison circuit including input ports to receive a pixel signal and a ramp signal, respectively, and structured to compare the pixel signal and the ramp signal to output a comparison signal; a sensing circuit coupled to the comparison circuit and structured to sense a common voltage variation amount from the comparison circuit, wherein the common voltage variation amount depends on the pixel signal such that the common voltage variation amount increases as the pixel signal increases; and a tail current control circuit coupled to the sensing circuit and structured to control a tail current amount of the comparison circuit based on the common voltage variation amount.

26 Claims, 7 Drawing Sheets

COMPARISON DEVICE AND CMOS IMAGE SENSOR INCLUDING THE SAME

CROSS-REFERENCE TO RELATED APPLICATION

This patent document claims the priority and benefits of Korean Patent Application No. 10-2018-0014626 filed on Feb. 6, 2018, which is incorporated herein by reference in its entirety.

TECHNICAL FIELD

The technology and implementations disclosed in this patent document relate to a comparison device and a complementary metal oxide semiconductor (CMOS) image sensor including the same.

BACKGROUND

In general, data stored in a photo diode (PD) of a pixel is transferred to a floating diffusion node which is an input node of a conversion transistor, e.g., a source follower transistor, through a transfer transistor. An output voltage of the conversion transistor, which is output of the pixel and referred to as a pixel signal, depends on the data transferred to the floating diffusion node, It is desirable to have a linear relationship between the amount the received incident: light at a pixel and the output signal from the pixel. As amount of an incident light on the PD of the pixel is increased, a test for checking a linearity of analog-to-digital conversion is performed and is sometimes referred to as "exposure linearity test."

The exposure linearity test shows that non-linearity occurs during the operation of an image sensor. For example, it has been observed that when the data of the PD is transferred to the floating diffusion node, non-linearity occurs. The non-linearity is also caused by a pixel structure.

Meanwhile, since a slope of a ramp signal has a linearity, a code error occurs in the pixel signal using the ramp signal.

Recently, the code error is required to be within 1%. However, since the non-linearity of the pixel signal becomes more severe as a size of the pixel signal increases, if the pixel signal has a large size, it becomes difficult to satisfy the required range for the code error and the code error may be beyond the required code error range of 1%.

SUMMARY

This patent document provides a comparison device and a complementary metal oxide semiconductor (CMOS) image sensor including the same for generating a code delay in performing a sampling operation and compensating a code error by reducing amount of a tail current of a comparison circuit as the size of the pixel signal is increased.

In an embodiment, a comparison device may include a comparison circuit including input ports to receive a pixel signal and a ramp signal, respectively, and structured to compare the pixel signal and the ramp signal to output a comparison signal; a sensing circuit coupled to the comparison circuit and structured to sense a common voltage variation amount from the comparison circuit, wherein the common voltage variation amount depends on the pixel signal such that the common voltage variation amount increases as the pixel signal increases; and a tail current control circuit coupled to the sensing circuit and structured to control a tail current amount of the comparison circuit based on the common voltage variation amount.

In an embodiment, a CMOS image sensor may include a pixel array comprising pixels arranged in rows and columns wherein each pixel is operable to respond to incident light to generate a pixel signal corresponding to the incident light received at each pixel; a row decoder coupled to the pixel array and operable to select and control pixels of the pixel array row by row; a ramp signal generation circuit structured to generate a ramp signal; a comparison circuit coupled to the ramp signal generation circuit to receive the ramp signal and to further receive a pixel signal from a pixel in the pixel array, wherein the comparison circuit is structured to be operable to compare the ramp signal with the pixel signal; a sensing circuit coupled to the comparison circuit and structured to sense a common voltage variation amount from the comparison circuit; a tail current control circuit coupled to the sensing circuit and structured to control a tail current amount of the comparison circuit based on the common voltage variation amount; a counter coupled to the comparison circuit to receive the comparison signal and operable to perform a counting operation based on the comparison signal; a memory coupled to the counter and operable to store information outputted from the counter; a column read-out circuit coupled to the memory and operable to output the information stored in the memory; and a control circuit coupled to and operable to control, the row decoder, the ramp signal generation circuit, the comparison circuit, the counter, the memory and the column read-out circuit.

In some implementations, the sensing circuit includes: a first capacitor coupled between the comparison circuit and the tail current control circuit; and a second capacitor coupled between the comparison circuit and the tail current control circuit. In some implementations, the sensing circuit includes: a first capacitor coupled between a gate terminal of a second input transistor of the comparison circuit and a gate terminal of a tail transistor of the comparison circuit; and a second capacitor coupled between a gate terminal of a first input transistor of the comparison circuit and a gate terminal of the tail transistor of the comparison circuit. In some implementations, the tail current control circuit includes: a switch connected to the sensing circuit and structured to perform sampling of a bias voltage of the comparison circuit; and a capacitor connected to the switch and structure o store a sampled bias voltage. In some implementations, the tail current control circuit includes: a switch having a first terminal coupled to a bias circuit for determining a gate voltage of a tail transistor of the comparison circuit and a second terminal coupled to the sensing circuit and the gate terminal of the tail transistor; and a capacitor having a first terminal coupled to the second terminal of the switch, the sensing circuit and a gate terminal of the tail transistor, and a second terminal coupled to a source terminal of the tail transistor. In some implementations, the tail current control circuit controls the tail current amount of the comparison circuit by adjusting a transfer conductance of the comparison circuit based on the common voltage variation amount. In some implementations, the sensing circuit includes a capacitor provided between the tail current control circuit and a source terminal of the first input transistor and the second input transistor of the comparison circuit. In some implementations, the sensing circuit includes a capacitor provided between a gate terminal of the tail transistor and a source terminal of the first input transistor and the second input transistor of the comparison circuit. In some implementations, the common voltage variation amount is a difference value between a first common voltage and a second common voltage, the second common voltage being a value of the ramp signal or the pixel signal when the value of the ramp signal is same as the value of the pixel signal. In some implementations, the first common voltage is a half value of the difference between the ramp signal and the pixel signal. In some implementations, the second common voltage is a voltage level of the pixel signal or the ramp signal when an analog-digital conversion is completed.

In an embodiment a CMOS image sensor may include pixels arranged in rows and columns, each pixel operable to generate a pixel signal in response to light incident on the pixel; a ramp signal generation circuit located to generate a ramp signal; a comparison circuit coupled to the pixels to receive the pixel signal from a pixel and the ramp signal from the ramp signal generation circuit and including a first transistor having a conductance value that changes based on a voltage variation that represents a difference between a first voltage and a second voltage, the first voltage being a half value of the difference between the ramp signal and the pixel signal and the second voltage being a value of the ramp signal or the pixel signal when the value of the ramp signal is same as the value of the pixel signal.

In some implementations, the first transistor has a gate voltage that changes based on the voltage variation. In some implementations, the voltage variation increases as the pixel signal increases. In some implementations, the comparison circuit further includes: a second transistor having a gate terminal through which the ramp signal is applied to the comparison circuit; and a third transistor having a gate terminal through which the pixel signal is applied to the comparison circuit. In some implementations, the CMOS image sensor further comprises: a sensing circuit including a first capacitor coupled to the gate terminal of the third transistor and a second capacitor coupled to the gate terminal of the second transistor, the sensing circuit operated to sense the voltage variation. In some implementations, the CMOS image sensor further comprises: a sensing circuit including a third capacitor provided between the gate terminal of the first transistor and a source terminal of the second transistor or a source terminal of the third transistor.

DETAILED DESCRIPTION

The disclosed technology can be implemented to provide an improved complementary metal oxide semiconductor (CMOS) image sensor with reduced nonlinearities in pixel responses to incident light. In implementations, such a CMOS image sensor may include a comparison device, which can compensate a non-linearity occurring in the CMOS image sensor. The non-linearity occurring in the image sensor causes undesired effects on the performance of the image sensor and such undesired effects become more problematic as a size of a pixel signal increases. Thus, the disclosed technology suggests approaches to accurately determining the size of the pixel signal and performing sampling of pixel signals to compensate the non-linearity of the pixel signal.

Figure 1:
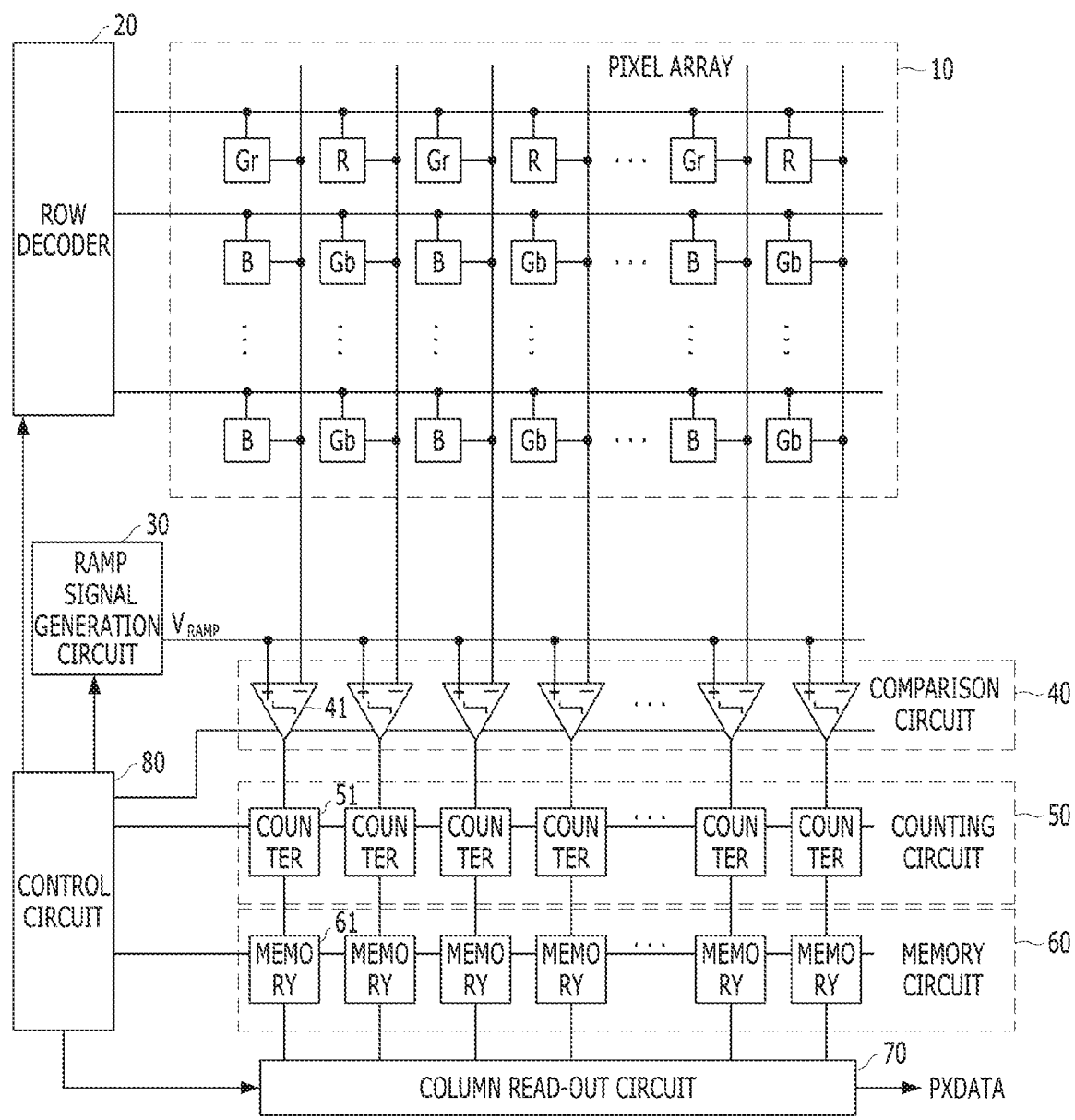
FIG. 1 is a diagram illustrating an example of a CMOS image sensor.

FIG. 1 is a diagram illustrating an example of a CMOS image sensor. The CMOS image sensor shown in FIG. 1 represents a CMOS image sensor of column parallel structure using a single-slope analog-to-digital conversion device and is provided to facilitate the understanding of the disclosed technology.

Referring to FIG. 1, the CMOS image sensor includes a pixel array 10 including imaging pixels arranged in rows and columns, a row decoder 20, a ramp signal generation circuit 30, a comparison circuit 40, a counting circuit 50, a memory circuit 60, a column read-out circuit 70 and a control circuit 80.

The pixel array 10 outputs pixel signals in response to incident light at individual imaging pixels. The row decoder 20 selects and controls pixels of the pixel array row by row. The ramp signal generation circuit 30 generates a ramp signal $V_{RAMP}$ in response to a control signal of the control circuit 80. The comparison circuit 40 includes two input ports or terminals to receive an outputs pixel signal from a pixel in the pixel array 10 and a ramp signal VR AMP from the ramp signal generation circuit 30 and is designed to compare the ramp signal $\backslash T_{RAMP}$ from the ramp signal generation circuit 30 with each pixel signal outputted from the pixel array 10.

The counting circuit 50 may receive output signals from the comparison circuit 40 and count the number of clock pulses of the control circuit 80 based on the output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 may be coupled to the row decoder 20, the ramp signal generation circuit 30, the comparison circuit 40, the counting circuit 50, the memory circuit 60 and the column read-out circuit 70 and control operations of the row decoder 20, the ramp signal generation circuit 30, the comparison circuit 40, the counting circuit 50, the memory circuit 60 and the column read-out circuit 70.

A CMOS image sensor may include the comparison circuit 40 that utilizes a correlated double sampling (CDS) technique to remove an offset value of the pixel.

The comparison circuit 40 includes a plurality of comparators 41, the counting circuit 50 includes a plurality of counters 51, and the memory circuit 60 includes a plurality of memories 61. In an example of a CMOS image sensor configuration, each column of the pixel array 10 includes the comparator 41, the counter 51 and the memory 61.

The operations of the comparator 41, the counter 51 and the memory 61 will be described with reference to FIG. 1 as below.

The comparator 41 has two input terminals that receive a pixel signal outputted from a column of the pixel array 10 and a ramp signal $V_{RAMP}$ outputted from the ramp signal generation circuit 30, respectively. The comparator 41 compares the ramp signal $V_{RAMP}$ with the pixel signal and outputs a comparison signal in response to control signal provided by the control circuit 80.

Since a voltage level of the ramp signal $V_{RAMP}$ increases or decreases as time passes, the ramp signal $V_{RAMP}$ crosses the pixel signal at some point in time. After this crossing point, the value of the comparison signal outputted from the comparator 41 is inverted, The counter 51 is used to count pulses during a period of time, for example, during when the pixel signal is above the ramp signal. The counter 51 is initialized by a reset control signal of the control circuit 80.

The memory 61 stores information relating to the count (e.g., number of clocks) provided by the counter 51 and outputs the information to the column read-out circuit 70 according to control signals of the control circuit 80. In some implementations, the CMOS image sensor may perform a counting operation on a reset signal (or a reset voltage) and then perform a counting operation on an image signal (a signal voltage).

Figure 2:
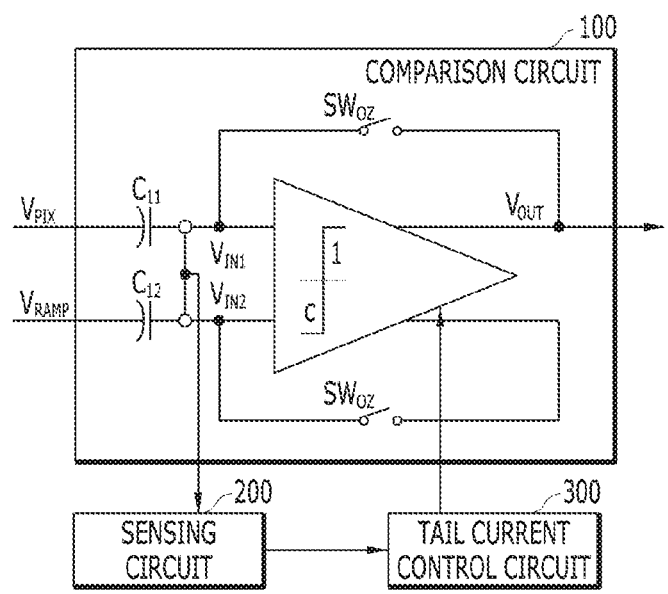
FIG. 2 is a diagram illustrating an example of a comparison device in accordance with an embodiment of the disclosed technology.

FIG. 2 is a diagram illustrating an example of a comparison device in accordance with an embodiment of the disclosed technology.

Referring to FIG. 2, a comparison device in accordance with an embodiment of the disclosed technology includes a comparison circuit 100, a sensing circuit 200 and a tail current control circuit 300.

The comparison circuit 100 compares a pixel signal $V_{PIX}$ and a ramp signal $V_{RAMP}$ and output a comparison signal. The sensing circuit 200 senses a common voltage variation amount $\Delta V_{CM}$ of the comparison circuit 100. The tail current control circuit 300 controls a tail current of the comparison circuit 100 based on the common voltage variation amount $\Delta V_{CM}$ sensed by the sensing circuit 200.

The common voltage variation amount $\Delta V_{CM}$ represents a voltage variation amount of the ramp signal $V_{RAMP}$ when a voltage value of the ramp signal $V_{RAMP}$ is changed along a voltage value of the pixel signal $V_{PIX}$. The common voltage variation amount $\Delta V_{CM}$ may be determined by a difference value between a first common voltage $V_{CM1}$ and a second common voltage $V_{CM2}$.

The first common voltage $V_{CM1}$ may be determined to be a half value of a difference between the pixel signal $V_{PIX}$ and the ramp signal $V_{RAMP}$.

The second common voltage $V_{CM2}$ may be determined to have a voltage level of the pixel signal $V_{PIX}$ or the ramp signal $V_{RAMP}$ when the analog-digital conversion is completed to make the voltage level of the pixel signal $V_{PIX}$ as same as that of the ramp signal $V_{RAMP}$.

The first common voltage $V_{CM1}$ and the second common voltage $V_{CM2}$ may be varied by a voltage value of the pixel signal $V_{PIX}$.

The tail current control circuit 300 controls a tail current of the comparison circuit 100 by adjusting a transfer conductance of the comparison circuit 100 according to the common voltage variation amount $\Delta V_{CM}$.

In general, during a CDS operation, since a counting value is set to the analog-digital conversion code value when the counting value is obtained until the difference value between the ramp signal $V_{RAMP}$ and the pixel signal $V_{PIX}$ reaches '0' and then is increased again, a difference level is '0' at any position of the pixel signal $V_{PIX}$. Thus, the difference value between the ramp signal $V_{RAMP}$ and the pixel signal $V_{PIX}$ does not provide much information on a size of the pixel signal $V_{PIX}$. In the disclosed technology, a size of the pixel signal $V_{PIX}$ may be determined by sensing an absolute common level, e.g., an absolute value, of the ramp signal $V_{RAMP}$ and the pixel signal $V_{PIX}$.

In the disclosed technology, a common voltage variation amount $\Delta V_{CM}$ is a difference value between a common level of an initial state of the pixel signal $V_{PIX}$ and the ramp signal $V_{RAMP}$, and a common level of the crossing point of the pixel signal $V_{PIX}$ and the ramp signal $V_{RAMP}$. Based on this common voltage variation amount $\Delta V_{CM}$, the size of the pixel signal $V_{PIX}$ can be accurately obtained. Further, the disclosed technology suggests reducing a current amount of the CDS based on the common voltage variation amount such that a gain of the CDS is reduced as the size of the pixel signal $V_{PIX}$ is increased. By doing so, a code delay is generated, and a non-linearity error is compensated.

Figure 3A:
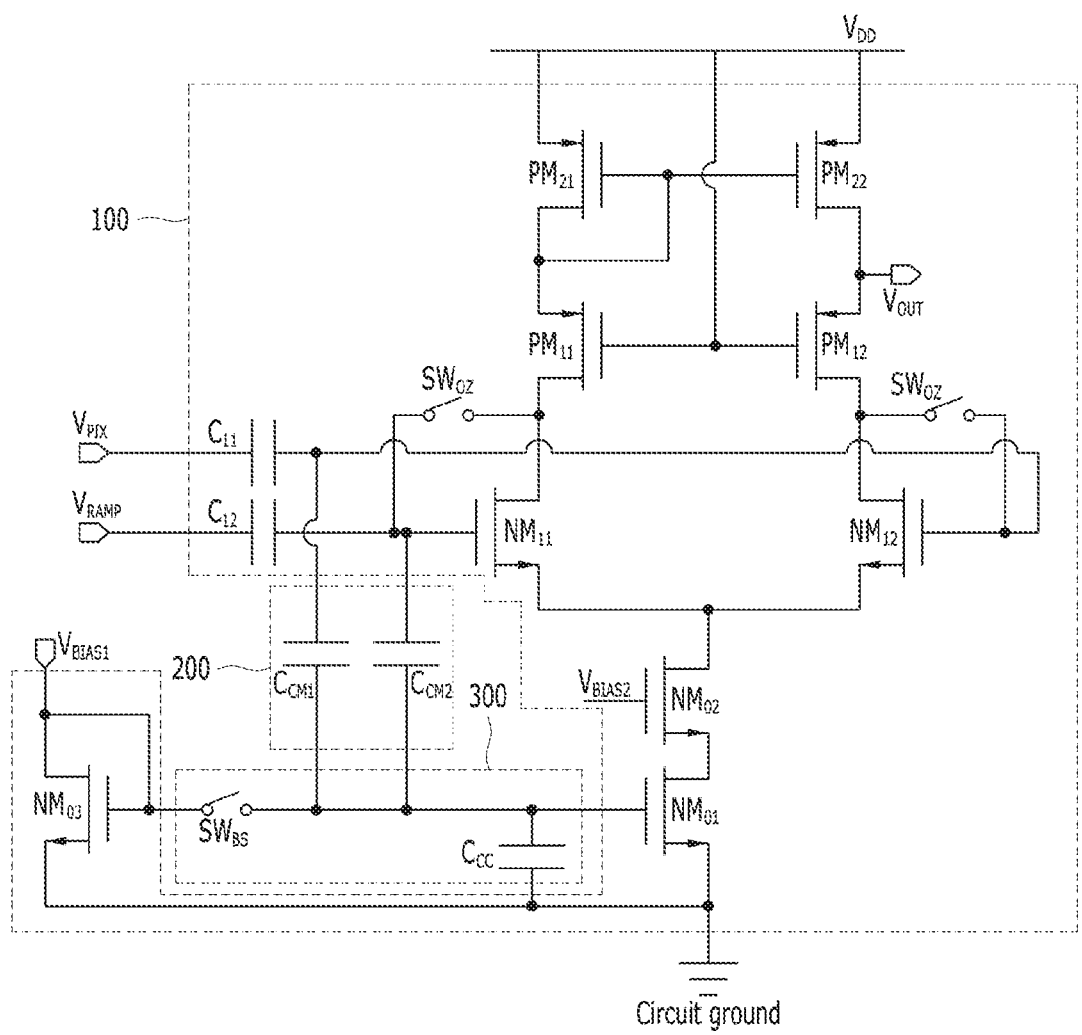
FIG. 3A is a circuit diagram illustrating an example of the comparison device shown in FIG. 2.

FIG. 3A is a circuit diagram illustrating an example of the comparison device shown in FIG. 2.

Referring to FIG. 3A, the comparison device includes the comparison circuit 100, the sensing circuit 200 and the tail current cot circuit 300.

Since the circuit configuration of the comparison circuit 100 is widely known to a skilled person in the disclosed technology, the detailed description of the comparison circuit 100 will be omitted.

The sensing circuit 200 includes a first common capacitor $C_{CM1}$ and a second common capacitor $C_{CM2}$.

The first common capacitor $C_{CM1}$ is provided between a first capacitor $C_{11}$ and the tail current control circuit 300, and the second common capacitor $C_{CM2}$ is provided between a second capacitor $C_{12}$ and the tail current control circuit 300.

The first common capacitor $C_{CM1}$ is coupled between a gate terminal of a third NMOS transistor $NM_{12}$, which is a second input transistor of the comparison circuit 100, and a gate terminal of a first NMOS transistor $NM_{01}$, which is a tail transistor of the comparison circuit 100.

The second common capacitor $C_{CM2}$ is coupled between a gate terminal of a second NMOS transistor $NW_{11}$, which is a first input transistor of the comparison circuit 100, and a gate terminal of the first NMOS transistor $NM_{01}$.

When an alternating current (AC) coupling voltage is applied to the gate terminals of the second MOS transistor $NM_{11}$ and the third NMOS transistor $NM_{12}$ through the first capacitor $C_{11}$ and the second capacitor $C_{12}$, the sensing circuit 200 senses that a first common voltage $V_{CM1}$ has a voltage level which is a half of a difference between the pixel signal $V_{PIX}$ and the ramp signal $V_{RAMP}$. The sensing circuit 200 further senses a second common voltage $V_{CM2}$ that represents a voltage level of the pixel signal or the ramp signal when the pixel signal and the ramp signal have the same voltage level. Based on the sensed voltages $V_{CM1}$ and $V_{CM2}$, a common voltage variation amount $\Delta V_{CM}$, that represents a difference between the first common voltage $V_{CM1}$ and the second common voltage $V_{CM2}$ is sensed or determined.

The tail current control circuit 300 includes first switch $SW_{BS}$ and a third capacitor $C_{CC}$.

The first switch $SW_{BS}$ samples a first bias voltage $V_{BIAS1}$ of the comparison circuit 100. A first terminal of the first switch $SW_{BS}$ is coupled to a bias circuit for determining a gate voltage of the first NMOS transistor $NM_{01}$, which is a tail transistor of the comparison circuit 100. A second terminal of the first switch $SW_{BS}$ is coupled to a gate terminal of the first NMOS transistor $NM_{01}$ and the first common capacitor $C_{CM2}$ of the sensing circuit 200.

The third capacitor $C_{CC}$ stores the sampled first bias voltage $V_{BIAS1}$. A first terminal of the third capacitor $C_{CC}$ is coupled to the second terminal of the first switch $SW_{BS}$, the first common capacitor $C_{CM1}$ of the sensing circuit 200 and the gate terminal of the first NMOS transistor $NM_{01}$. A second terminal of the third capacitor $C_{CC}$ is coupled to a source terminal of the first NMOS transistor $NM_{01}$.

If the first switch $SW_{BS}$ is switched on, the first bias voltage VBIAS1 is sampled and stored on the third capacitor $C_{CC}$, and if the first switch $SW_{BS}$ is switched off, the first common capacitor $C_{CM1}$, the second common capacitor $C_{CM2}$ and the third capacitor $C_{CC}$ are floated. In this case, the voltage stored in the third capacitor $C_{CC}$ is varied according to the common voltage variation amount $\Delta V_{CM}$. Through this voltage variation stored in the third capacitor $C_{CC}$, a gate voltage of the first NMOS transistor $NM_{01}$ is varied as well. Thus, the amount of the tail current of the comparison circuit 100 is varied.

An analog-digital conversion speed of the comparison circuit 100 may be controlled by the variation of the tail current amount. During the analog-digital conversion operation, more codes can be allocated according to the common voltage variation amount $\Delta V_{CM}$.

Figure 3B:
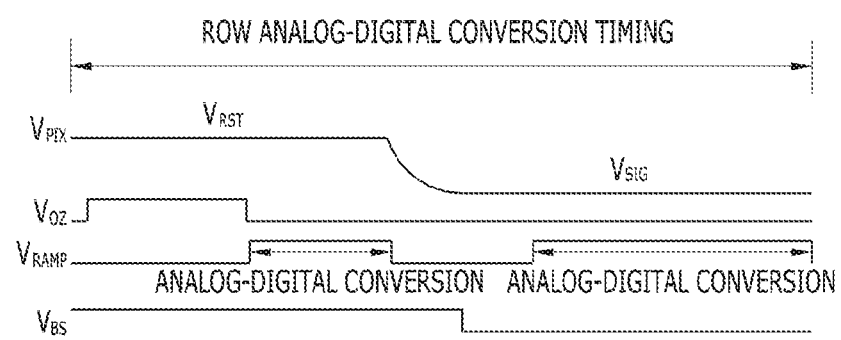
FIG. 3B is a timing diagram illustrating a row analog-digital conversion of the comparison device shown in FIGS. 2 and 3A.

For example, if a pixel signal value of an input period of the signal voltage VSIG, which is shown in FIG. 3B, increases, non-linearity gets worse to cause a gain error when the pixel signal is transferred from a pixel to an input terminal of the comparison circuit 100. This means a greater code error correction is needed. In this case, the value of the pixel signal obtained at the input terminal of the comparison circuit 100 becomes smaller than the actual value of the pixel signal before being transferred to the input terminal of the comparison circuit 100. Thus, the analog-digital converted code value smaller than the expected code value of the pixel signal is obtained. In order to overcome this problem, the disclosed technology provide some implementations of a comparison device operated as described below.

If the pixel signal value of the input period of the signal voltage $V_{SIG}$ is increased, the difference value between the pixel signal value and the ramp signal value is increased, and the common voltage variation amount $\Delta V_{CM}$ is greatly increased. To mitigate the increase of the common voltage variation amount $\Delta V_{CM}$, it is suggested to adjust a transfer conductance of the first NMOS transistor $NM_{01}$ of the comparison circuit 100 based on the increased common voltage variation amount $\Delta V_{CM}$. By doing so, the delay of the comparison circuit 100 is caused or generated according to the size of the pixel signal $V_{PIX}$, which results in adding the code value and compensating the non-linearity.

FIG. 3B is a timing diagram illustrating a row analog-digital conversion of the comparison device shown in FIGS. 2 and 3A.

The pixel signal $V_{PIX}$ is a signal read out from a pixel and is inputted to the comparison circuit 100. The pixel signal includes a reset signal $V_{RST}$ and the signal voltage $V_{SIG}$.

In performing the analog-to-digital conversion, a correlated double sampling (CDS) is often used to eliminate some unwanted noise. In the CDS, a reset signal $V_{RST}$ is read out first, and then a signal voltage $V_{SIG}$ is read out.

The comparison device 200 performs the CDS operation to acquire a difference value between the reset signal $V_{RST}$ and the signal voltage $V_{SIG}$, ($|V_{RST}-V_{SIG}|$), and determines the acquired difference value as the value of the pixel signal.

The analog-to-digital conversion device converts the value of the pixel signal. Which is determined as discussed above, to a digital value. The CDS operation is often called an analog CDS operation.

The CDS operation includes a sampling operation and a holding operation that are sequentially performed. During the CDS operation, the reset voltage $V_{RST}$ is sampled and held in the first capacitor $C_{11}$. Subsequently, the analog-to-digital-converting operation is performed to obtain a digital code value based on an absolute value of the reset signal $V_{RST}$, and to obtain a digital code value based on the difference value ($|V_{RST}-V_{SIG}|$) between the reset signal $V_{RST}$ and the signal voltage $V_{SIG}$. Thus, an analog-to-digital conversion efficiency can be improved by removing the non-linearity and unwanted offset, which is caused by the analog-to-digital conversion, through the above-described CDS operation.

More specifically, referring to FIGS. 2 and 3A, when the reset voltage $V_{RST}$ is read out from the pixel, the two switches $SW_{OZ}$ are switched on according to the control signal of the control circuit (not shown), and a reset voltage value is sampled and held in the first capacitor $C_{11}$. A voltage at a first input voltage node $V_{IN1}$ becomes $-(V_{RST}-V_{CO})$, and a voltage at a second input voltage node $V_{IN2}$ becomes $V_{CO}$, where $V_{CO}$ denotes an offset voltage caused by circuitry in the comparator.

Subsequently, the two switches $SW_{OZ}$ are switched off and the ramp signal $V_{RAMP}$ is applied to the second input voltage node $V_{IN2}$ through the second capacitor $C_{12}$, and then the comparator compares the first input voltage $V_{IN1}$ with the second input voltage $V_{IN2}$, and outputs the comparison result. The analog-to-digital conversion for the reset voltage $V_{RST}$ is performed according to the comparison signal.

Next, the signal voltage $V_{SIG}$ of the pixel signal $V_{PIX}$ is applied to the comparator through the first capacitor $C_{11}$, and a voltage at the first input voltage node $V_{IN1}$ becomes $V_{SIG}-V_{RST}+N_{CO}$ and a voltage at the second input voltage node $V_{IN2}$ becomes $V_{CO}$. The voltage difference between the first input voltage $V_{IN1}$ and the second input voltage node $V_{IN2}$ becomes $V_{SIG}-V_{RST}$, and the analog CDS operation may be performed through the above-described process.

Subsequently, by performing an analog-to-digital-conversion on the difference value between the reset voltage $V_{RS1}$ and the signal voltage $V_{SIG}$, ($|V_{RST}-V_{SIG}|$) a corresponding digital code value is acquired, and by subtracting the analog-to-digital conversion code value of the reset voltage $V_{RST}$, the digital CDS operation is performed. Thus, analog-to-digital conversion performance may be improved through the above-described process.

Next, "$V_{OZ}$" represents a signal for switching on or off two switches $SW_{OZ}$, and is operated in the reset voltage input period. The reset voltage $V_{RST}$ of the pixel signal $V_{PIX}$ is sampled on the first sampling capacitor $C_{11}$. The ramp signal $V_{RAMP}$ is generated a ramp signal generation circuit for the analog-digital conversion.

"$V_{BS}$" represents a signal for switching on or off the first switch $SW_{BS}$, which is added in the embodiment of the disclosed technology. During the reset voltage input period, the sensing circuit 200 and the tail current control circuit 300 are disabled by switching on the first switch $SW_{BS}$. During the signal voltage input period, the first bias voltage $V_{BIAS}$ is sampled and stored on the third capacitor $C_{CC}$.

Herein, the voltage stored on the third capacitor $C_{CC}$ is varied according to the common voltage variation amount $\Delta V_{CM}$, and the transfer conductance of the first NMOS transistor $NM_{01}$ is controlled based on this voltage variation. The variation of the signal value of the reset voltage input period is relatively smaller than the variation of the signal value of the signal voltage input period. The variation of the pixel signal $V_{PIX}$ is large in the signal voltage input period. Thus, non-linearity occurs.

Figure 4:
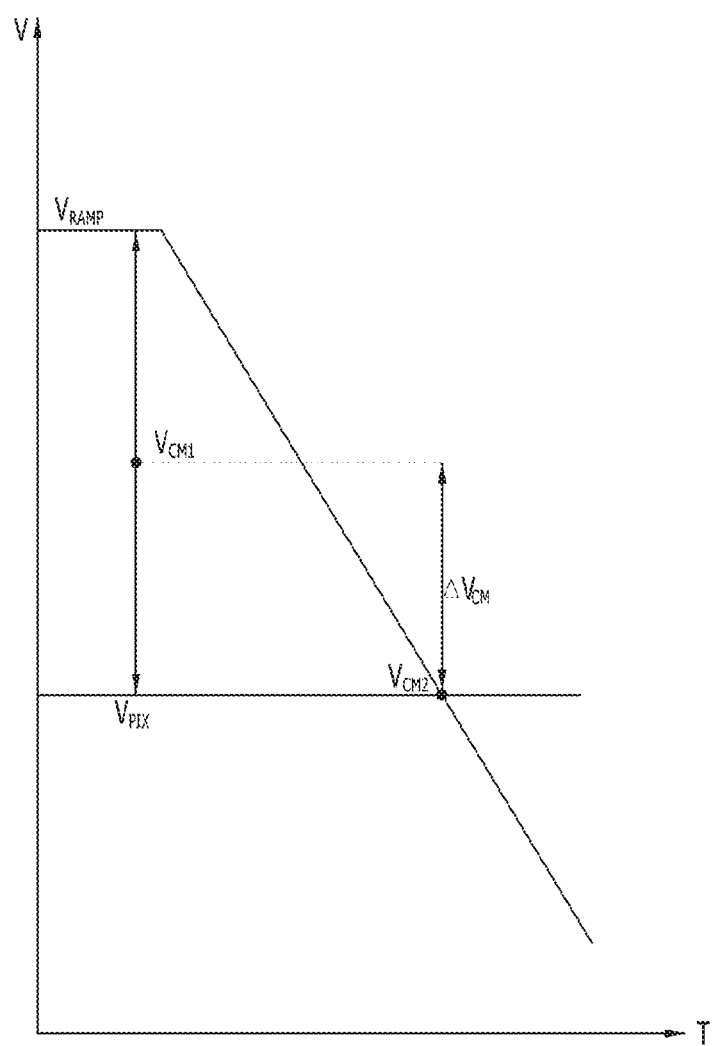
FIG. 4 is a diagram illustrating a common voltage in accordance with an embodiment of the disclosed technology.

FIG. 4 is a diagram illustrating a common voltage in accordance with an embodiment of the disclosed technology. FIG. 4 shows the common voltage variation amount $\Delta V_{CM}$ according to the first common voltage $V_{CM1}$ and the second common voltage $V_{CM2}$.

Referring to FIG. 4, the first common voltage $V_{CM1}$ is determined according to the pixel signal voltage of the signal voltage input period. The second common voltage $V_{CM2}$ is determined as a voltage value of the ramp signal $V_{RAMP}$ or the pixel signal $V_{PIX}$ when the voltage value of the ramp signal $V_{RAMP}$ is same as the voltage value of the pixel signal $V_{PIX}$. Thus, the common voltage variation amount $\Delta V_{CM}$, which is the difference value between the first common voltage $V_{CM1}$ and the second common voltage $V_{CM2}$, is determined.

Figure 5:
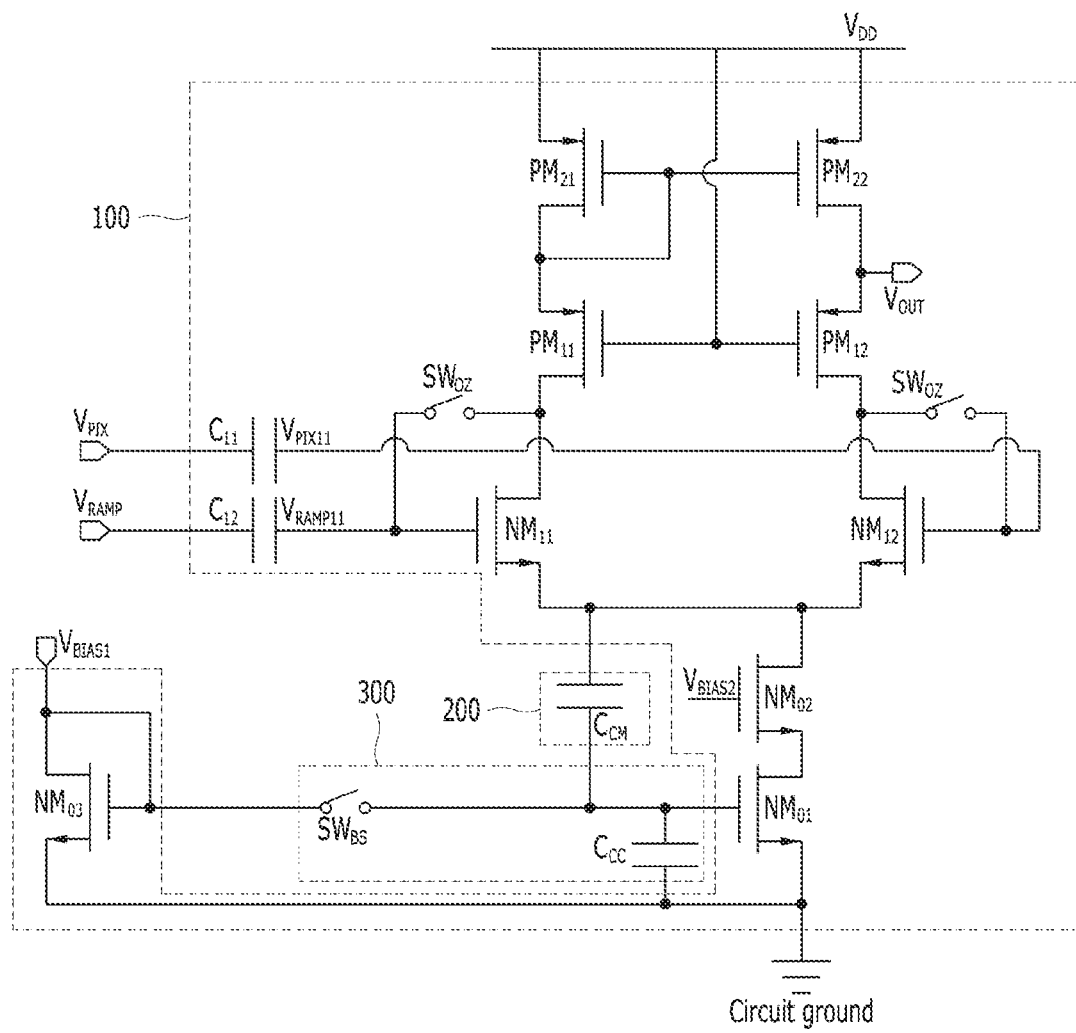
FIG. 5 is a circuit diagram illustrating an example of a comparison device in accordance with another embodiment of the disclosed technology.

FIG. 5 is a circuit diagram illustrating an example of a comparison device in accordance with another embodiment of the disclosed technology.

Referring to FIG. 5, a comparison device in accordance with another embodiment of the disclosed technology includes a comparison circuit 100, a sensing circuit 200 and a tail current control circuit 300.

Referring to FIG. 5, since the operation and configuration of the comparison circuit 100 shown in FIG. 5 is same as the operation and configuration of the comparison circuit 100 shown in FIG. 3A, the detailed description of the comparison circuit 100 will he omitted.

The sensing circuit 200 includes a common capacitor $C_{CM}$, which is provided between the tail current control circuit 300 and a source terminal of the second MOS transistor $NM_{11}$ and the third NMOS transistor $NM_{12}$ of the first comparison circuit 100. The second NMOS transistor $NM_{11}$ represents a first input transistor of the comparison circuit 100 and the third NMOS transistor $NM_{12}$ represents a second input transistor of the comparison circuit 100.

Instead of the first common capacitor $C_{CM1}$ and the second common capacitor $C_{CM2}$ shown in FIG. 3A., the common capacitor $C_{CM}$ shown in FIG. 5 is provided between the tail current control circuit 300 and a source terminal of the second MOS transistor $NM_{11}$ and the third NMOS transistor $NM_{12}$ of the first comparison circuit 100. Herein, a second gate-source voltage $V_{GS11}$ and a third gate-source voltage $V_{GS12}$ are applied to the gate terminal of the second NMOS transistor $NM_{11}$ and the third NMOS transistor $NM_{12}$, respectively. In this case, $V_{CM1}$ is obtained by an equation as below: $((V_{RAMP11}-V_{S11})-(V_{PIX11}-V_{S12}))/2=V_{CM1}$, and $V_{PIX11}=V_{G12}$ and $V_{RAMP11}=V_{G11}$, where $V_{PIX11}$ represents a first pixel voltage, $V_{RAMP11}$ represents a first ramp voltage, $V_{S11}$ represents a source voltage of the second NMOS transistor $NM_{11}$ and $VS_{12}$ represents a source voltage of the third NMOS transistor $NM_{12}$.

Other operations and configurations of the tail current control circuit 300 shown in FIG. 5 is same as the operation and configuration of the tail current control circuit 300 shown in FIG. 3A, and thus, the detailed description of the tail current control circuit 300 will be omitted.

Figure 6:
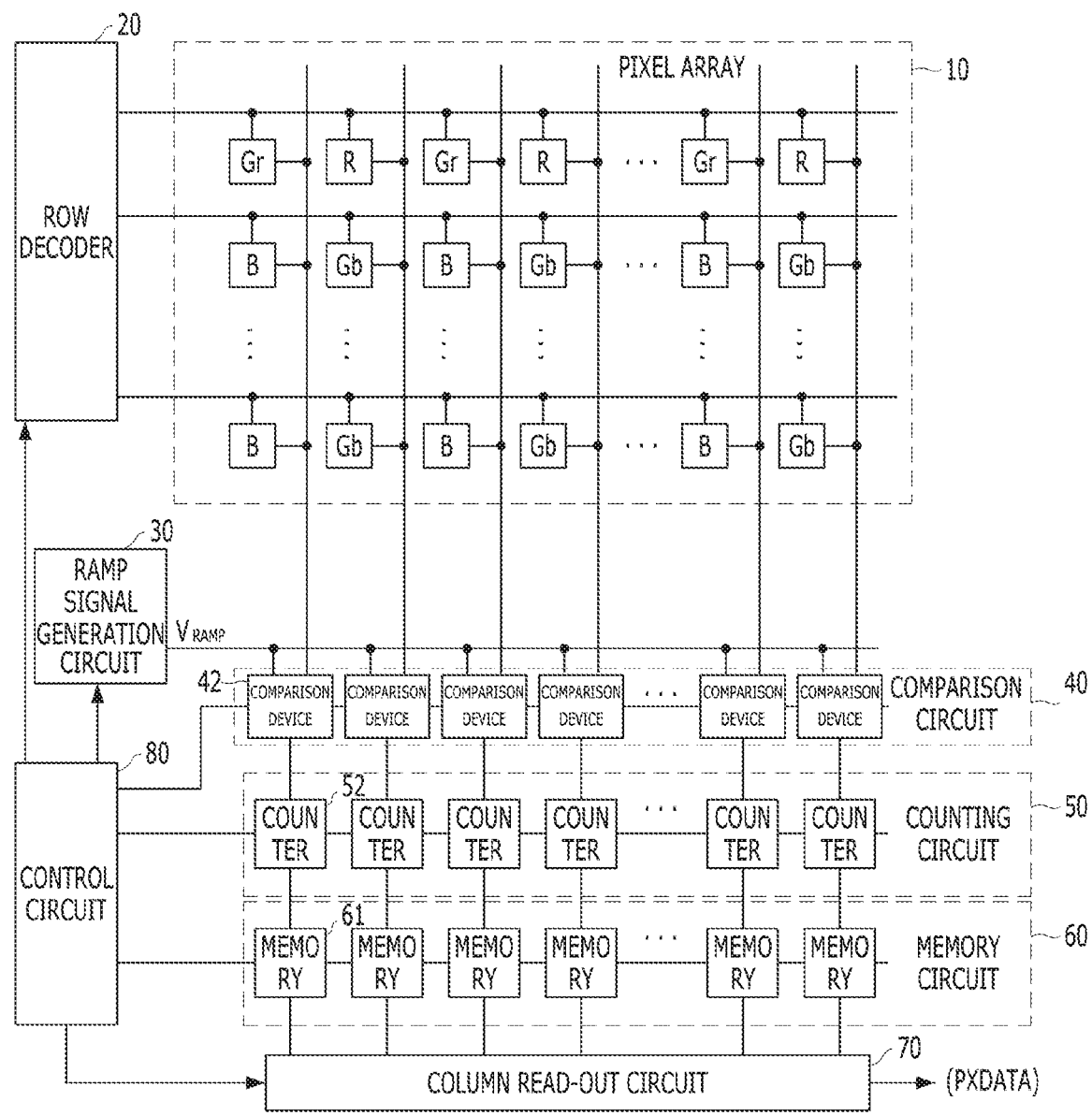
FIG. 6 is a diagram illustrating an example of a CMOS image sensor in accordance with embodiments of the disclosed technology.

FIG. 6 is a diagram illustrating an example of a CMOS image sensor including a comparison device in accordance with embodiments of the disclosed technology.

Referring to FIG. 6, the CMOS image sensor in accordance with embodiments of the disclosed technology includes a pixel array 10, a row decoder 20, a ramp signal generation circuit 30, a comparison circuit 40, a counting circuit 50, a memory circuit 60, a column read-out circuit 70 and a control circuit 80.

The pixel array 10 outputs pixel signals in response to incident light. The row decoder 20 selects and controls pixels of the pixel array row by row. The ramp signal generation circuit 30 generates a ramp signal $V_{RAMP}$ (includ-ing a coarse ramping signal and a fine ramping signal) in response to a control signal of the control circuit. The comparison circuit 40 compares the ramp signal $V_{RAMP}$ of the ramp signal generation circuit 40 with each pixel signal outputted from the pixel array.

The counting circuit 50 counts the number of clock pulses of the control circuit 80 according to output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 controls operations of the row decoder 20, the ramp signal generation circuit 30, the comparison circuit 40, the counting circuit 50, the memory circuit 60 and the column read-out circuit 70.

Here, the comparison circuit 40 includes the comparison device 42, which is implemented using the comparison device shown in FIG. 2 or the comparison device shown in FIG. 5 in accordance with embodiments of the disclosed technology.

A comparison device and a complementary metal oxide semiconductor (CMOS) image sensor including the same in accordance with embodiments of the disclosed technology generates a code delay and compensates a code error by reducing amount of a tail current of a comparison circuit s the size of the pixel signal is increased.

Although various embodiments and specific examples have been described, various changes and modifications may be made based on what is described and illustrated.

What is claimed is:

1. A comparison device, comprising:
   a comparison circuit including input ports to receive a pixel signal and a ramp signal, respectively, and structured to compare the pixel signal and the ramp signal to output a comparison signal;
   a sensing circuit coupled to the comparison circuit and structured to sense a common voltage variation amount from the comparison circuit, wherein the common voltage variation amount depends on the pixel signal such that the common voltage variation amount increases as the pixel signal increases; and
   a tail current control circuit coupled to the sensing circuit and structured to control a tail current amount of the comparison circuit based on the common voltage variation amount.

2. The comparison device of claim 1, wherein the sensing circuit includes:
   a first capacitor coupled between the comparison circuit and the tail current control circuit; and
   a second capacitor coupled between the comparison circuit and the tail current control circuit.

3. The comparison device of claim 1, wherein the sensing circuit includes:
   a first capacitor coupled between a gate terminal of a second input transistor of the comparison circuit and a gate terminal of a tail transistor of the comparison circuit; and
   a second capacitor coupled between a gate terminal of a first input transistor of the comparison circuit and a gate terminal of the tail transistor of the comparison circuit.

4. The comparison device of claim 3, wherein the sensing circuit includes a capacitor provided between a gate terminal of the tail transistor and a source terminal of the first input transistor and the second input transistor of the comparison circuit.

5. The comparison device of claim 1, wherein the tail current control circuit includes:
   a switch connected to the sensing circuit and structured to perform sampling of a bias voltage of the comparison circuit; and
   a capacitor connected to the switch and structured to store a sampled bias voltage.

6. The comparison device of claim 1, wherein the tail current control circuit includes:
   a switch having a first terminal coupled to a bias circuit for determining a gate voltage of a tail transistor of the comparison circuit and a second terminal coupled to the sensing circuit and the gate terminal of the tail transistor; and
   a capacitor having a first terminal coupled to the second terminal of the switch, the sensing circuit and a gate terminal of the tail transistor, and a second terminal coupled to a source terminal of the tail transistor.

7. The comparison device of claim 1, wherein the tail current control circuit controls the tail current amount of the comparison circuit by adjusting a transfer conductance of the comparison circuit based on the common voltage variation amount.

8. The comparison device of claim 1, wherein the sensing circuit includes a capacitor provided between the tail current control circuit and a source terminal of a first input transistor and a second input transistor of the comparison circuit.

9. The comparison device of claim 1, wherein the common voltage variation amount is a difference value between a first common voltage and a second common voltage, the second common voltage being a value of the ramp signal or the pixel signal when the value of the ramp signal is same as the value of the pixel signal.

10. The comparison device of claim 9, wherein the first common voltage is a half value of the difference between the ramp signal and the pixel signal.

11. The comparison device of claim 9, wherein the second common voltage is a voltage level of the pixel signal or the ramp signal when an analog-digital conversion is completed.

12. A complementary metal oxide semiconductor (CMOS) image sensor, comprising:
   a pixel array comprising pixels arranged in rows and columns wherein each pixel is operable to respond to incident light to generate a pixel signal corresponding to the incident light received at each pixel;
   a row decoder coupled to the pixel array and operable to select and control pixels of the pixel array row by row;
   a ramp signal generation circuit structured to generate a ramp signal;
   a comparison circuit coupled to the ramp signal generation circuit to receive the ramp signal and to further receive a pixel signal from a pixel in the pixel array, wherein the comparison circuit is structured to be operable to compare the ramp signal with the pixel signal;
   a sensing circuit coupled to the comparison circuit and structured to sense a common voltage variation amount from the comparison circuit;
   a tail current control circuit coupled to the sensing circuit and structured to control a tail current amount of the comparison circuit based on the common voltage variation amount;
   a counter coupled to the comparison circuit to receive the comparison signal and operable to perform a counting operation based on the comparison signal;
   a memory coupled to the counter and operable to store information outputted from the counter;
   a column read-out circuit coupled to the memory and operable to output the information stored in the memory; and
   a control circuit coupled to and operable to control, the row decoder, the ramp signal generation circuit, the comparison circuit, the counter, the memory and the column read-out circuit.

13. The CMOS image sensor of claim 12, wherein the sensing circuit includes:
   a first capacitor coupled between the comparison circuit and the tail current control circuit; and
   a second capacitor coupled between the comparison circuit and the tail current control circuit.

14. The CMOS image sensor of claim 12, wherein the sensing circuit includes:
   a first capacitor coupled between a gate terminal of a second input transistor of the comparison circuit and a gate terminal of a tail transistor of the comparison circuit; and
   a second capacitor coupled between a gate terminal of a first input transistor of the comparison circuit and a gate terminal of the tail transistor of the comparison circuit.

15. The CMOS image sensor of claim 14, e sensing circuit includes a capacitor provided between a gate terminal of the tail transistor of the comparison circuit and a source terminal of the first input transistor or the second input transistor of the comparison circuit.

16. The CMOS image sensor of claim 12, wherein the tail current control circuit includes:
   a switch connected to the sensing circuit and structured to perform sampling of a bias voltage; and
   a capacitor connected to the switch and structured to store a sampled bias voltage.

17. The CMOS image sensor of claim 12, wherein the tail current control circuit includes:
   a switch having a first terminal coupled to a bias circuit for determining a gate voltage of a tail transistor of the comparison circuit and a second terminal coupled to the sensing circuit and the gate terminal of the tail transistor; and
   a capacitor having a first terminal coupled to the second terminal of the switch, the sensing circuit and a gate terminal of the tail transistor, and a second terminal coupled to a source terminal of the tail transistor.

18. The CMOS image sensor of claim 12, wherein the tail current control circuit controls the tail current amount of the comparison circuit by adjusting a transfer conductance of the comparison circuit based on the common voltage variation amount.

19. The CMOS image sensor of claim 12, wherein the sensing circuit includes a capacitor provided between the tail current control circuit and a source terminal of a first input transistor or a second input transistor of the comparison circuit.

20. The CMOS image sensor of claim 12, wherein the common voltage variation amount is a difference value between a first common voltage and a second common voltage, the first common voltage being a half value of the difference between the ramp signal and the pixel signal and the second common voltage being a value of the ramp signal or the pixel signal when the value of the ramp signal is same as the value of the pixel signal.

21. A complementary metal oxide semiconductor (CMOS) image sensor including:
   pixels arranged in rows and columns, each pixel operable to generate a pixel signal in response to light incident on the pixel;

a ramp signal generation circuit located to generate a ramp signal;

a comparison circuit coupled to the pixels to receive the pixel signal from a pixel and the ramp signal from the ramp signal generation circuit and including a first transistor having a conductance value that changes based on a voltage variation that represents a difference between a first voltage and a second voltage, the first voltage being a half value of the difference between the ramp signal and the pixel signal and the second voltage being a value of the ramp signal or the pixel signal when the value of the ramp signal is same as the value of the pixel signal.

22. The CMOS image sensor of claim 21., wherein the first transistor has a gate voltage that changes based on the voltage variation.

23. The CMOS image sensor of claim 21, wherein the voltage variation increases as the pixel signal increases.

24. The CMOS image sensor of claim 21, wherein the comparison circuit further includes:

a second transistor having a gate terminal through which the ramp signal is applied to the comparison circuit; and a third transistor having a gate terminal through which the pixel signal is applied to the comparison circuit.

25. The CMOS image sensor of claim 24, further comprising:

a sensing circuit including a first capacitor coupled to the gate terminal of the third transistor and a second capacitor coupled to the gate terminal of the second transistor, the sensing circuit operated to sense the voltage variation.

26. The CMOS image sensor of claim 24, further comprising:

a sensing circuit including a third capacitor provided between the gate terminal of the first transistor and a source terminal of the second transistor or a source terminal of the third transistor.

* * * * *